(12) United States Patent
Choi

(10) Patent No.: US 9,023,582 B2
(45) Date of Patent: May 5, 2015

(54) PHOTOSENSITIVE POLYMER, RESIST COMPOSITION INCLUDING THE PHOTOSENSITIVE POLYMER AND METHOD OF PREPARING RESIST PATTERN USING THE RESIST COMPOSITION

(71) Applicant: Sang-Jun Choi, Yongin (KR)

(72) Inventor: Sang-Jun Choi, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 56 days.

(21) Appl. No.: 13/795,268

(22) Filed: Mar. 12, 2013

(65) Prior Publication Data

US 2014/0141372 A1 May 22, 2014

(30) Foreign Application Priority Data

Nov. 20, 2012 (KR) .................. 10-2012-0131950

(51) Int. Cl.
| | | |
|---|---|---|
| G03F 7/20 | (2006.01) | |
| C08G 63/66 | (2006.01) | |
| G03F 7/004 | (2006.01) | |
| G03F 7/039 | (2006.01) | |

(52) U.S. Cl.
CPC .............. C08G 63/66 (2013.01); *G03F 7/0045* (2013.01); *G03F 7/039* (2013.01); G03F 7/0395 (2013.01); *Y10S 430/114* (2013.01); *Y10S 430/128* (2013.01)

(58) Field of Classification Search
USPC ............... 430/270.1, 913, 927, 322, 325, 329
See application file for complete search history.

(56) References Cited

U.S. PATENT DOCUMENTS

| | | | | |
|---|---|---|---|---|
| 5,672,675 A | * | 9/1997 | Green et al. .................. 528/307 |
| 5,747,203 A | * | 5/1998 | Nozomi et al. ............... 430/59.2 |
| 6,004,724 A | * | 12/1999 | Yamato et al. .............. 430/281.1 |
| 6,403,670 B1 | | 6/2002 | Ishidoya et al. |
| 7,611,821 B2 | | 11/2009 | Nishi et al. |
| 8,168,367 B2 | | 5/2012 | Watanabe et al. |
| 2004/0175570 A1 | * | 9/2004 | Kung et al. .................. 428/413 |
| 2006/0135637 A1 | * | 6/2006 | Hillshafer et al. ............ 521/172 |
| 2007/0100083 A1 | * | 5/2007 | Arakawa et al. .............. 525/342 |
| 2007/0249748 A1 | * | 10/2007 | Kura et al. ....................... 522/12 |
| 2008/0050674 A1 | * | 2/2008 | Miyazawa et al. .......... 430/273.1 |
| 2009/0163674 A1 | * | 6/2009 | Sakane et al. ................. 525/438 |
| 2011/0236831 A1 | | 9/2011 | Hasegawa et al. |
| 2011/0256406 A1 | * | 10/2011 | Farrell et al. .................. 428/412 |

FOREIGN PATENT DOCUMENTS

| | | | |
|---|---|---|---|
| JP | 55023125 A | * | 2/1980 |
| JP | 2000-298344 A | | 10/2000 |
| JP | 2008214604 A | * | 9/2008 |
| JP | 2009120765 A | * | 6/2009 |
| JP | 2009263441 A | * | 11/2009 |
| JP | 2010-237413 A | | 10/2010 |
| JP | 2011-215632 | | 10/2011 |
| KR | 10-2001-0080815 A | | 8/2001 |
| KR | 10-0373962 B1 | | 2/2003 |
| KR | 10-2004-0077277 A | | 9/2004 |
| KR | 10-2011-0107294 | | 9/2011 |
| KR | 10-2012-0012773 | | 2/2012 |

OTHER PUBLICATIONS

Montaudo et al, "Characterization of Copolymer sequences by Fat Atom Bombardment Mass Spectrometry.2.Indentification of Oligomers Contained in Alternating and Random Copolyesters with Photolabile Units in the Main Chain", Macromolecules, 22, pp. 627-632 (1989).*

Matsukawa et al., "Photocurable oligi(hemiacetal ester)s having methacrylate side chains", European Polymer Journal, 45 2087-2095 (2009).*

Machine translation of JP 2008-214604 (no date).*

Korean Registration Determination Certificate mailed Dec. 3, 2014 in corresponding Korean Patent Application No. 10-2012-0131950.

* cited by examiner

*Primary Examiner* — Amanda C. Walke
(74) *Attorney, Agent, or Firm* — Lee & Morse, P.C.

(57) ABSTRACT

A photosensitive polymer includes a repeating unit represented by Formula 1 and the photosensitive polymer has a weight average molecule weight of from about 3,000 to about 50,000:

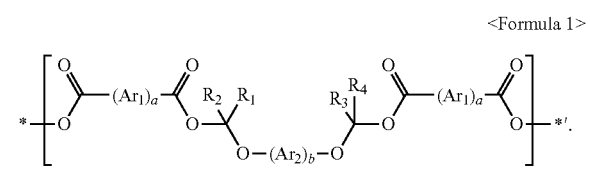

<Formula 1>

19 Claims, No Drawings

PHOTOSENSITIVE POLYMER, RESIST COMPOSITION INCLUDING THE PHOTOSENSITIVE POLYMER AND METHOD OF PREPARING RESIST PATTERN USING THE RESIST COMPOSITION

CROSS-REFERENCE TO RELATED PATENT APPLICATION

This application claims the benefit of and priority to Korean Patent Application No. 10-2012-0131950, filed on Nov. 20, 2012, in the Korean Intellectual Property Office, and entitled: "PHOTOSENSITIVE POLYMER, RESIST COMPOSITION INCLUDING THE PHOTOSENSITIVE POLYMER AND METHOD OF PREPARING RESIST PATTERN USING THE RESIST COMPOSITION," the disclosure of which is incorporated by reference herein in its entirety.

BACKGROUND

1. Field

Embodiments relate to a photosensitive polymer, a resist composition including the photosensitive polymer, and a method of preparing a resist pattern using the resist composition.

2. Description of the Related Art

Along with the technology trend towards large-size and thin-film type displays, there has been an increasing demand for the technology of forming high-resolution and high-sensitivity resist patterns.

SUMMARY

Embodiments relate to a novel photosensitive polymer, a resist composition including the photosensitive polymer, and a method of forming a resist pattern using the resist composition.

According to an embodiment, there is provided a photosensitive polymer including a repeating unit represented by Formula 1 below and having a weight average molecule weight of from about 3,000 to about 50,000:

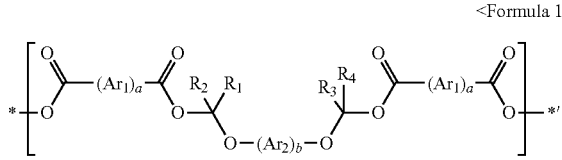
<Formula 1> wherein, in Formula 1, $Ar_1$ is selected from among: a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group; and a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{20}$ aryl group, and a $C_2$-$C_{20}$ heteroaryl group;

$Ar_2$ is selected from among: —C(=O)—, —O—, a $C_1$-$C_{20}$ alkylene group, a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group; and a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{20}$ aryl group, and a $C_2$-$C_{20}$ heteroaryl group;

a and b are each independently an integer from 1 to 5; and $R_1$ to $R_4$ are each independently selected from among: a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, $C_1$-$C_{20}$ alkyl group, $C_1$-$C_{20}$ alkoxy group; a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_6$-$C_{20}$ aryl group, and a $C_2$-$C_{20}$ heteroaryl group; a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group.

The photosensitive polymer may include a repeating unit represented by Formula 1A below:

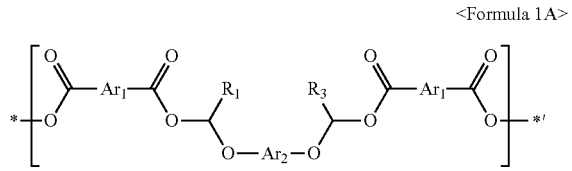
<Formula 1A> wherein, in Formula 1A, $Ar_1$ is selected from among: a phenylene group, a naphthylene group, and a phenanthrenylene group; and a phenylene group, a naphthylene group, and a phenanthrenylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group;

$Ar_2$ is selected from among: a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, and a cycloheptadienylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, and a cycloheptadienylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; and $R_1$ and $R_3$ are each independently selected from among: a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; and a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a phenyl group, a naphthyl group, and an anthryl group.

According to an embodiment, there is provided a resist composition including: a repeating unit represented by Formula 1 above and having a weight average molecular weight of from about 3,000 to about 50,000; a photoacid generator; and a solvent:

According to an embodiment, there is provided a method of forming a resist pattern, the method including: applying the above-described resist composition onto a substrate; removing the solvent of the resist composition to form a resist film; exposing the resist film to light along a predetermined pattern; and developing the resist film exposed to the light along the predetermined pattern to form the resist pattern.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

According to an embodiment, a photosensitive polymer includes a repeating unit represented by Formula 1 below:

<Formula 1>

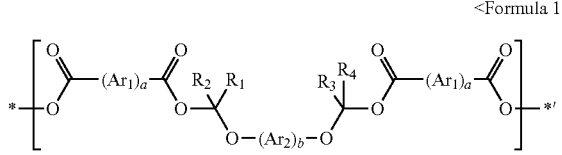

In Formula 1, $Ar_1$ is selected from among: a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group; and a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group that are substituted with at least one of a deuterium atom, a halogen atom (for example, F, Cl, Br, or I), a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{20}$ aryl group, and a $C_2$-$C_{20}$ heteroaryl group.

In some embodiments, in Formula 1, $Ar_1$ may be selected from among: a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthryl group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, a oxazolylene group, and a triazolylene group; and a phenylene group, a pentalenylene group, an indenylene group, a naphthylene group, an azulenylene group, a heptalenylene group, an indacenylene group, an acenaphthylene group, a fluorenylene group, spiro-fluorenylene group, a phenalenylene group, a phenanthrenylene group, an anthryl group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, a isothiazolylene group, a benzothiazolylene group, an isoxazolylene group, an oxazolylene group, and a triazolylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group.

For example, in Formula 1, $Ar_1$ may be selected from among: a phenylene group, a naphthylene group, and a phenanthrenylene group; and a phenylene group, a naphthylene group, and a phenanthrenylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group, but is not limited thereto.

In some other embodiments, in Formula 1, $Ar_1$ may be selected from among: a phenylene group; and a phenylene group that is substituted with at least one of a deuterium atom, a halogen atom (for example, F), a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, and a $C_1$-$C_{20}$ alkyl group (for example, a methyl group, an ethyl group, a propyl group, a butyl group, a pentyl group, a hexyl group, a heptyl group, or an octyl group).

For example, in Formula 1, $Ar_1$ may be selected from among the groups represented by Formulae 2A to 2C below:

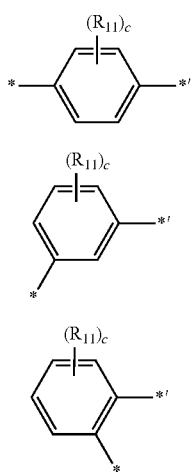

Formula 2A

Formula 2B

Formula 2C

In Formulae 2A to 2C, $R_{11}$ may be selected from among: a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; and c may be an integer from 1 to 4. In Formulae 2A to 2C, c indicates the number of $R_{11}$'s. When c is 2 or greater, the at least two $R_{11}$'s may be identical to or differ from each other. In Formulae 2A to 2C, * and *' indicate binding sites of $Ar_1$ in Formula 1.

In Formula 1, a indicates the number of $Ar_1$'s, and may be an integer from 1 to 5. In some embodiments, a may be an integer of 1, 2, or 3. For example, a may be an integer of 1. When a is 2 or greater, the at least two $Ar_1$'s may be identical to or differ from each other.

In Formula 1, $Ar_2$ may be selected from among: —C(=O)—, —O—, a $C_1$-$C_{20}$ alkylene group, a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group; and a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{20}$ aryl group, and a $C_2$-$C_{20}$ heteroaryl group.

In some embodiments, in Formula 1, $Ar_2$ may be selected from among: a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthryl group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, and a triazolylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthryl group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, and a triazolylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group, but is not limited thereto.

In some other embodiments, in Formula 1, $Ar_2$ may be selected from among: a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, and a cycloheptadienylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, and a cycloheptadienylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group, but is not limited thereto.

In some other examples, in Formula 1, $Ar_2$ may be selected from among the groups represented by Formulae 3A to 3C:

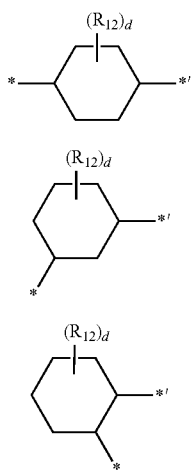

Formula 3A

Formula 3B

Formula 3C

In Formulae 3A to 3C, $R_{12}$ is selected from among: a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$alkyl group, and a $C_1$-$C_{20}$alkoxy group; and d is an integer from 1 to 8. In Formulae 3A to 3C, d indicates the number of $R_{12}$'s. When d is 2 or greater, the at least two $R_{12}$'s may be identical to or differ from each other. In Formulae 3A to 3C, * and *' indicate binding sites of $Ar_2$ in Formula 1.

In Formula 1, b indicates the number of $Ar_2$'s, and may be an integer from 1 to 5. In some embodiments, b may be an integer of 1, 2, or 3. For example, b may be an integer of 1. When b is 2 or greater, the at least two $Ar_2$'s may be identical to or differ from each other.

In Formula 1, $R_1$ to $R_4$ are each independently selected from among: a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a alkoxy group; and a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_6$-$C_{20}$ aryl group, and a $C_2$-$C_{20}$ heteroaryl group; a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group.

In some embodiments, in Formula 1, $R_1$ to $R_4$ may be each independently selected from among: a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group; and a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, phenyl group, a naphthyl group, and an anthryl group, but are not limited thereto.

In Formula 1, * and *' indicate binding sites with adjacent repeating units.

In an embodiment, the photosensitive polymer may consist of only a repeating unit represented by Formula 1 above.

The photosensitive polymer may have a weight average molecular weight of from about 3,000 to about 50,000, and in some embodiments, a weight average molecular weight of from about 5,000 to about 15,000. When the weight average molecular weight of the photosensitive polymer is within these ranges, a photoresist pattern including the photosensitive polymer may have improved film formability, for example, in terms of strength of the film and adhesion to a substrate.

In some embodiments, the photosensitive polymer may include a repeating unit represented by Formula 1A below:

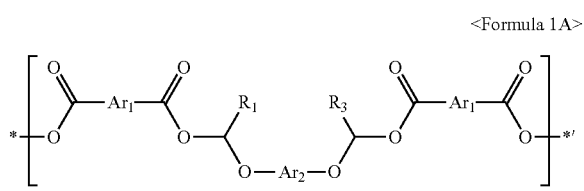

<Formula 1A>

In Formula 1A, $Ar_1$, $Ar_2$, $R_1$, and $R_3$ are as defined above. In Formula 1A, * and *' indicate binding sites with adjacent repeating units.

For example, in an embodiment, the photosensitive polymer may consist of only a repeating unit represented by Formula 1A above.

In some embodiments, in Formula 1A, i) $Ar_1$ may be selected from among: a phenylene group, a naphthylene group, and a phenanthrenylene group; and a phenylene group, a naphthylene group, and a phenanthrenylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group (for example, any one of the groups represented by Formulae 2A to 2C above);

ii) $Ar_2$ may be selected from among: a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, and a cycloheptadienylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, and a cycloheptadienylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group (for example, any one of the groups represented by Formulae 3A to 3C above); and iii) $R_1$ and $R_3$ may be each independently selected from among: a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; and a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a phenyl group, a naphthyl group, and an anthryl group (for example, a methyl group, an ethyl group, a propyl group, a butyl group, or a pentyl group).

The photosensitive polymer may include a repeating unit 1 or 2 below, but is not limited thereto:

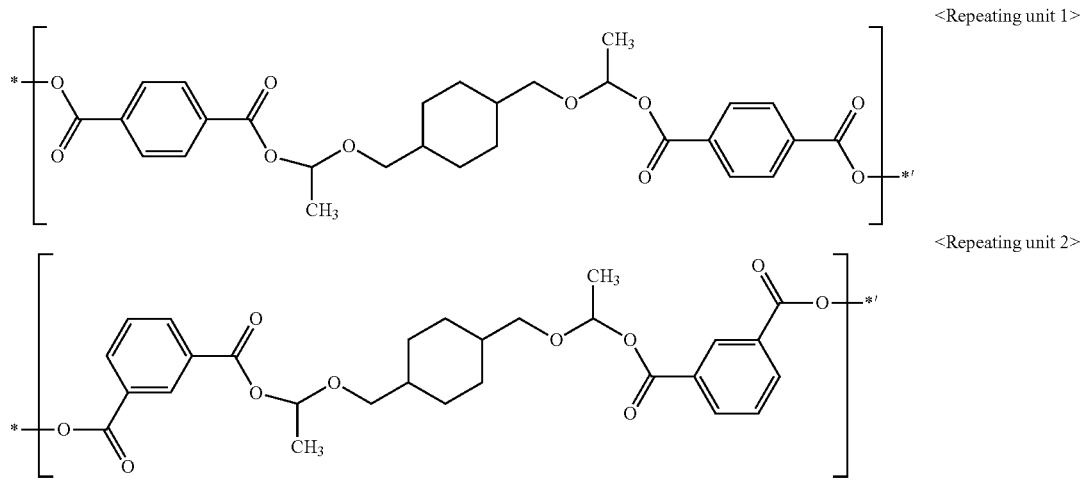

<Repeating unit 1>

<Repeating unit 2>

In Repeating units 1 and 2 above, * and *' indicate binding sites with adjacent repeating units.

For example, in an embodiment, the photosensitive polymer may consist of only a repeating unit 1 or 2 above.

According to an embodiment, a method of preparing the photosensitive polymer may include reacting a first material represented by Formula 10 below with a second material represented by Formula 11 below, but is not limited thereto:

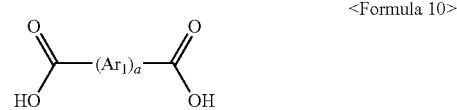

<Formula 10>

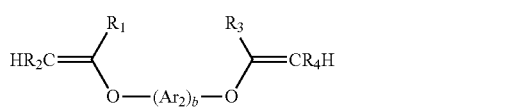

<Formula 11>

In Formulae 10 and 11, $Ar_1$, $Ar_2$, a, b, and $R_1$ to $R_4$ are as defined above. The reacting of the first material and the second material may be performed by a suitable organic synthesis method.

The photosensitive polymer includes a divalent acetal moiety in a main chain (see Formula 1' below), and thus may be easily decomposable in the presence of a small amount of an acid during the exposure process at room temperature. Accordingly, a high-resolution and high-sensitivity resist pattern may be formed using a resist composition including the photosensitive polymer. For example, when a resist pattern is formed using a resist composition including the photosensitive polymer, an edge region in (of) a cross-section of the resist pattern may be substantially perpendicular to a surface of a substrate with the resist pattern thereon.

<Formula 1'>

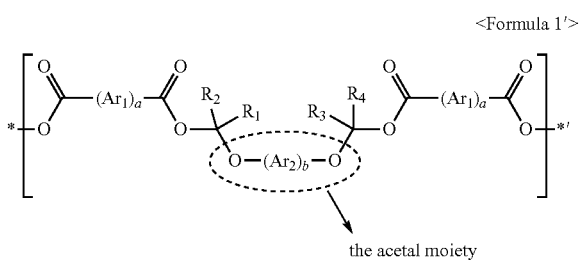

the acetal moiety

Furthermore, due to a high photodecomposition of the photosensitive polymer as described above, a high-resolution and highly-sensitivity resist pattern may be formed without post-exposure baking (PEB) for facilitating decomposition of the photosensitive polymer in the resist composition after the exposure process. Thus, using the resist composition including the photosensitive polymer may reduce processing costs and time.

For example, the photosensitive polymer may be used for a resist composition for forming a positive pattern.

According to another embodiment, a resist composition includes the above-described photosensitive polymer, a photoacid generator, and a solvent.

The photosensitive polymer of the resist composition is as described above, and thus a detailed description thereof will not be repeated here.

An amount of the photosensitive polymer in the resist composition may be from about 10 parts to about 30 parts by weight, and in some embodiments, from about 10 parts to about 20 parts by weight, based on 100 parts by weight of a total amount of the photosensitive polymer and the solvent. When the amount of the photosensitive polymer is within these ranges, the resist composition may have good flowability and viscosity appropriate for applying onto the substrate. Furthermore, it may become easy to remove the solvent to obtain a resist film.

The photoacid generator of the resist composition facilitates decomposition of the photosensitive polymer by generating an acid upon exposure to light.

The photoacid generator may include at least one of sulfonium salt, iodonium salt, sulfonyldiazomethane, N-sulfonyloxydicarboxylmide, and oximesulfonate. For example, the photoacid generator may include oximesulfonate, but is not limited thereto.

Non-limiting examples of sulfonium salt are triphenylsulfonium p-toluenesulfonate, triphenylsulfonium camphorsulfonate, triphenylsulfonium pentafluorobenzenesulfonate, triphenylsulfonium=nonafluorobutanesulfonate, triphenylsulfonium 4-(p-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(p-toluenesulfonyloxy)benzenesulfonate, 4-tert-butylphenyldiphenylsulfonium camphorsulfonate, 4-tert-butylphenyldiphenylsulfonium 2,4,6-triisopropylbenzenesulfonate, tris(4-methylphenyl)sulfonium camphorsulfonate, and tris(4-tert-butylphenyl)sulfonium camphorsulfonate.

Non-limiting examples of sulfonyldiazomethane are bis(tert-butylsulfonyl)diazomethane, bis(cyclohexylsulfonyl)diazomethane, bis(2,4-dimethylphenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxy)phenylsulfonyldiazomethane, and bis(4-tert-butylphenylsulfonyl)diazomethane.

Non-limiting examples of N-sulfonyloxyimide are N-camphorsulfonyloxy-5-norbornene-2,3-dicarboxylic acid imide, N-p-toluenesulfonyloxy-5-norbornene-2,3-dicarboxylic acid imide, (5-(10-camphorsulfonyl)oxyimino-5H-thiophene-2-ylidene)(2-methylphenyl)acetonitrile, and (5-(p-toluenesulfonyl)oxyimino-5H-thiophene-2-ylidene)(2-methylphenyl)acetonitrile.

Non-limiting examples of oximesulfonate are 2-oxo-2-phenylethylthiacyclopentanium 2-benzoyloxy-1,1,3,3,3-pentafluoropropanesulfonate, 2-oxo-2-phenylethylthiacyclopentanium 2-cyclohexanecarbonyloxy-1,1,3,3,3-pentafluoropropanesulfonate, triphenylsulfonium perfluoro(1,3-propylenebissulfonyl)imide, triphenylsulfonium bis(pentafluoroethylsulfonyl)imide, 2-(2,2,3,3,4,4,5,5-octafluoro-1-(nonafluorobutylsulfonyloxyimino)pentyl)fluorene, 2-(2,2,3,3,4,4-pentafluoro-1-(nonafluorobutylsulfonyloxyimino)butyl)fluorene, 2-(2,2,3,3,4,4,5,5,6,6-decafluoro-1-(nonafluorobutylsulfonyloxyimino)hexyl)fluorene, 2-(2,2,3,3,4,4,5,5-octafluoro-1-(2-(cyclohexanecarbonyloxy)-1,1,3,3,3-pentafluoropropanesulfonyloxyimino)pentyl)fluorene, 2-(2,2,3,3,4,4-pentafluoro-1-(2-(cyclohexanecarbonyloxy)-1,1,3,3,3-pentafluoropropanesulfonyloxyimino)butyl)fluorene, and 2-(2,2,3,3,4,4,5,5,6,6-decafluoro-1-(nonafluorobutylsulfonyloxyimino)hexyl)fluorene.

An amount of the photoacid generator may be from about 0.1 parts to about 10 parts by weight, and in some embodiments, from about 1 part to about 10 parts by weights, and in some other embodiments, from about 1 part to about 3 parts by weight, based on 100 parts by weight of the photosensitive polymer. When the amount of the photoacid generator is within these ranges, the resist pattern may have reduced roughness and retain appropriate sensitivity to light exposure.

The solvent of the resist composition may be selected from among organic solvents that may dissolve the photosensitive polymer, the photoacid generator, and other additives. Non-limiting examples of the solvent are ketones, such as cyclohexanone and methyl-n-amyl ketone; alcohols, such as 3-methoxybutanol, 3-methyl-3-methoxybutanol, 1-methoxy-2-propanol, and 1-ethoxy-2-propanol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters, such as propylene glycol monomethyl ether acetate, propylene glycol monoethyl ether acetate, lactic acid ethyl, pyrubic acid ethyl, acetic acid butyl, 3-methoxypropionic acid methyl, 3-ethoxypropionic acid ethyl, acetic acid tert-butyl, propionic acid tert-butyl, and propylene glycol monotert-butyl ether acetate; and lactones, such as γ-butyrolactone, which may be used alone or in a combination with at least two thereof.

The resist composition may further include, in addition to the photosensitive polymer, the photoacid generator, and the solvent as described above, an organic base for preventing profile distortion of the resist pattern (for example, T-topping or flooring). The organic base may include an amine-based compound. The amine-based material may be a tertiary amine. Non-limiting examples of the amine-based material are triethanol amine, triisobutyl amine, triisooctylamine, diethanolamine, and a combination of at least two thereof.

An amount of the organic base may be from about 0.1 parts to about 3 parts by weight, and in some embodiments, from about 0.5 parts to about 3 parts by weight, based on 100 parts by weight of the photoacid generator. When the amount of the organic base is within these ranges, pattern distortion may be substantially prevented during the formation of the resist pattern.

According to another embodiment, a method of forming a resist pattern using the above-described resist composition includes: applying the above-described resist composition onto a substrate; removing the solvent of the resist composition to form a resist film; exposing the resist film to light along a predetermined pattern; and developing the resist film exposed to the light along the predetermined pattern to form the resist pattern.

The substrate may be a suitable substrate including a resist pattern formation region.

A detailed description of the resist composition is provided above, and will not be repeated herein.

The applying of the resist composition onto the substrate may be performed using a suitable method, for example, spin coating, slit coating, dip coating, or the like.

Subsequently, the solvent is removed from the resist composition applied onto the substrate to form a resist film. The removing of the solvent may be performed by soft-baking. Although the conditions for the soft-baking process depend on the types and amounts of the photosensitive polymer, the photoacid generator, the solvent, and the like, a thermal treatment temperature for the soft-baking may be from about 90° C. to about 180° C. (for example, from about 110° C. to about 140° C.), and a thermal treatment time therefor may be from about 60 seconds to about 120 seconds.

As used herein, the term "resist film" means a film resulting from removing at least part of the solvent from the resist composition applied onto the substrate.

Subsequently, the resist film is subjected to exposure using an exposure light source with a predetermined energy. For example, the exposure light source may be KrF, ArF, or $F_2$ eximer laser. To selectively expose the resist film to light to obtain a predetermined pattern, an appropriate mask may be used.

During the exposure process, the photosensitive polymer in an exposed region of the resist film may be decomposed by the exposure light in the presence of an acid generated from the photoacid generator. Since the photosensitive polymer includes a divalent acetal moiety (see Formula 1'), it is apt to be decomposed even in the presence of a small amount of acid.

Since the photosensitive polymer is highly sensitive to light, the exposure process may be performed at room temperature. Furthermore, due to a high photodecomposition of the photosensitive polymer as described above, a high-resolution and highly-sensitivity resist pattern may be formed without post-exposure baking (PEB) for facilitating decomposition of the photosensitive polymer in the resist composition after the exposure process (although PEB may also be used). Accordingly, when using a resist composition including the photosensitive polymer to form a resist pattern, the selective exposure of the resist film to light along a predetermined pattern may be followed by a developing process, without a PEB process. Thus, processing costs may be reduced.

Subsequently, the resist film exposed along the predetermined pattern is developed into a resist pattern. A developing solution for the development may be selected from among the materials that are miscible with the exposed region of the resist film, but are not reactive to a non-exposed region of the resist film. For example, the developing solution may be tetramethylammonium hydroxide (TMAH), but is not limited thereto.

Hereinafter, the embodiments will be described in detail with reference to the following synthesis examples and other examples. However, these examples are for illustrative purposes only and are not intended to limit the scope of the embodiments.

EXAMPLES

Example 1

Synthesis of polymer 1

25 mmol of terephthalic acid and 25 mmol of cyclohexane dimethanol divinyl ether were mixed with propylene glycol monomethyl ether acetate (PGMEA, 15 wt % solution) as a solvent, and then reacted together at about 130° C. for about 24 hours to obtain a polymer 1-containing solution (PGMEA solution containing 15 wt % of polymer 1). The polymer 1 was found to consist of a repeating unit 1 below and to have a weight average molecular weight (Mw) of about 15,000 as measured by gel permeation chromatography (GPC) based on polystyrene.

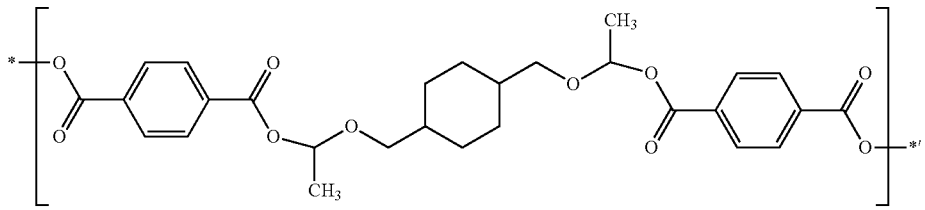

<Repeating unit 1>

Preparation of Resist Composition 1

100 g of the polymer 1-containing solution (PGMEA solution containing 15 wt % of polymer 1), 0.3 g of Irgacure PAG 121 (available from BASF) as a photoacid generator (PGA), and 6 mg of triethanol amine as an organic base were mixed together, and then filtered through a 0.2 μm filter, thereby preparing a resist composition 1.

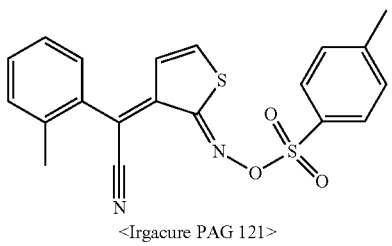 [SMILES: Cc1ccc(S(=O)(=O)O/N=C2\SC=C\C2=C(\C#N)c2ccccc2C)cc1]

<Irgacure PAG 121>

Example 2

Synthesis of Polymer 2

25 mmol of isophthalic acid and 25 mmol of cyclohexane dimethanol divinyl ether were mixed with propylene glycol monomethyl ether acetate (PGMEA, 15 wt % solution) as a solvent, and then reacted together at about 130° C. for about 24 hours to obtain a polymer 2-containing solution (PGMEA solution containing 15 wt % of polymer 2). The polymer 2 was found to consist of a repeating unit 2 below and to have a weight average molecular weight (Mw) of about 13,000 as measured by GPC based on polystyrene.

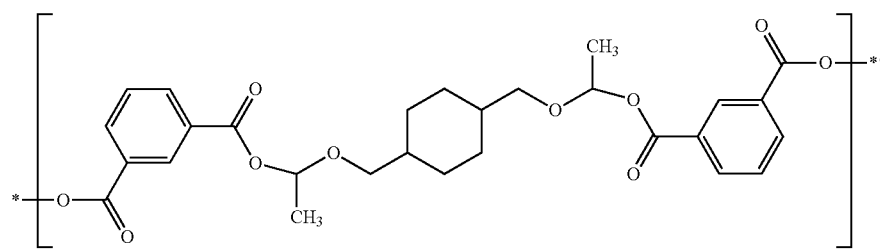

<Repeating unit 2>

Preparation of resist composition 2

A resist composition 2 was prepared in the same manner as in the preparation of the resist composition 1 in Example 1, except that the polymer 2-containing solution, instead of the polymer 1-containing solution, was used.

Comparative Example A

A commercially available resist composition (SOP-531, available from AZEM) (hereinafter, "resist composition A") including Novolak resin and diazonaphthaquinone (DNQ) was prepared. The Novolak resin of the resist composition A had a weight average molecular weight of from about 5,000 to about, and an amount of the DNQ was from about 20 parts to about 30 parts by weight based on 100 parts by weight of the Novolak resin.

Evaluation Example

Pattern Formability Evaluation

1) The resist composition 1 of Example 1 was coated on a glass using a slit coating method, and then thermally treated at about 100° C. for about 90 seconds to form a resist film 1. Thereafter, with a mask with stripe openings having a width of about 2.0 μm disposed on the resist film 1, the resist film 1 was exposed to light at an energy of about 20 mJ/cm$^2$. Subsequently, the exposed resist film 1 was developed using tetramethylammonium hydroxide (TMAH, 2.38 wt % solution) for about 60 seconds to remove the exposed regions of the resist film 1, thereby forming a resist pattern with a line gap (space) of about 2.0 μm. As a result of observing a cross-section of the resist pattern, edge regions of the cross-section of the resist pattern were found to be substantially vertical with respect to a surface of the glass with the resist pattern.

2) The resist composition 2 of Example 2 was coated on a glass using a slit coating method, and then thermally treated at about 100° C. for about 90 seconds to form a resist film 2. Thereafter, with a mask with stripe openings having a width of about 2.0 μm disposed on the resist film 2, the resist film 2 was exposed to light at an energy of about 21 mJ/cm$^2$. Subsequently, the exposed resist film 2 was developed using TMAH (2.38 wt % solution) for about 60 seconds to remove the exposed regions of the resist film 2, thereby forming a resist pattern with a line gap (space) of about 2.0 μm. As a result of observing a cross-section of the resist pattern, edge regions of the cross-section of the resist pattern were found to be substantially vertical with respect to a surface of the glass with the resist pattern.

3) The resist composition A of Comparative Example A was coated on a glass using a slit coating method, and then thermally treated at about 100° C. for about 90 seconds to form a resist film A. Thereafter, with a mask with stripe openings having a width of about 2.5 μm disposed on the resist film A, the resist film A was exposed to light at an energy of about 40 mJ/cm$^2$. Subsequently, the exposed resist film A was developed using TMAH (2.38 wt % solution) for about 70 seconds to remove the exposed regions of the resist film A, thereby forming a resist pattern with a line gap (space) of about 2.5 μm. As a result of observing a cross-section of the resist pattern, edge regions of the cross-section of the resist pattern were found to have slopes with respect to a surface of the glass with the resist pattern.

The above-described evaluation example is summarized in Table 1 below.

TABLE 1

| Resist composition | Thermal treatment conditions | Exposure energy (mJ/cm$^2$) | Development time (sec) | Resolution (space width) (μm) |
|---|---|---|---|---|
| Resist composition 1 | 100° C., 90 sec | 20 | 60 | 2.0 |
| Resist composition 2 | 100° C., 90 sec | 21 | 60 | 2.0 |
| Resist composition A | 100° C., 90 sec | 40 | 70 | 2.5 |

Referring to Table 1 above, using the resist composition 1 or 2 is found to form a resist pattern with a high resolution.

As described above, according to the one or more embodiments, due to being easily decomposable during exposure at room temperature, and easily dissolvable in a developing solution after the exposure, the photosensitive polymer may have high-contrast characteristics. Therefore, when using a resist composition including the photosensitive polymer, it may be easy to form a high-resolution, highly photosensitive resist pattern.

By way of summary and review, a resist composition for forming resist patterns may include a photosensitive material and a solvent. Resist patterns may be classified into either a positive pattern or a negative pattern depending on whether the photosensitive material in the resist composition is curable or decomposable upon exposure to light. In particular, when an exposed region of the photosensitive material may be decomposed through the exposure process and be removed by a developing solution, a positive pattern may be formed. When the exposed region of the photosensitive material is cured while a non-exposed region thereof is removed by the developing solution, a negative pattern may be formed. There is a demand for forming a high-resolution and high-precision pattern in manufacturing organic light-emitting devices. Forming the high-resolution and high-precision pattern requires technology for forming a highly sensitive resist pattern with a high resolution. Therefore, there is a demand for improving a resist composition for forming the highly sensitive, high-resolution resist pattern.

The photosensitive polymer according to the embodiments may have high-contrast characteristics and, when using a resist composition including the photosensitive polymer, it may allow for the formation of a high-resolution, highly photosensitive resist pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive polymer, comprising:
a repeating unit represented by Formula 1, the photosensitive polymer having a weight average molecule weight of from about 3,000 to about 50,000:

<Formula 1>

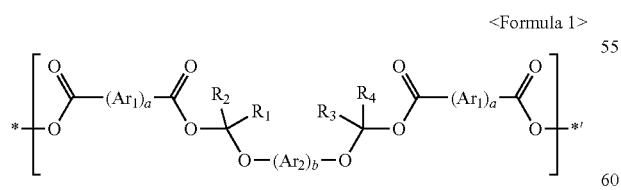

wherein, in Formula 1,
$Ar_1$ is selected from among:
a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group, and
a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{20}$ aryl group, and a $C_2$-$C_{20}$ heteroaryl group;

$Ar_2$ is selected from among:
—C(=O)—, —O—, a $C_1$-$C_{20}$ alkylene group, a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group, and
a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{20}$ aryl group, and a $C_2$-$C_{20}$ heteroaryl group;

a and b are each independently an integer from 1 to 5, provided that:
when a is 2 or greater, the $Ar_1$ in $(Ar_1)_a$ are the same or different from each other, and
when b is 2 or greater, the $Ar_2$ in $(Ar_2)_b$ are the same or different from each other; and $R_1$ to $R_4$ are each independently selected from among:
a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, $C_1$-$C_{20}$ alkyl group, $C_1$-$C_{20}$ alkoxy group,
a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_6$-$C_{20}$ aryl group, and a $C_2$-$C_{20}$ heteroaryl group,
a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, and
a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group.

2. The photosensitive polymer of claim 1, wherein $Ar_1$ is selected from among:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthryl group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, and a triazolylene group, and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthryl group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, and a triazolylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group.

3. The photosensitive polymer of claim 1, wherein $Ar_1$ is selected from among:

a phenylene group, and a phenylene group that is substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, and a $C_1$-$C_{20}$ alkyl group.

4. The photosensitive polymer of claim 1, wherein $Ar_1$ is selected from among groups represented by Formulae 2A to 2C:

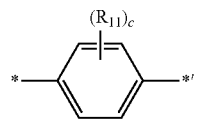

Formula 2A

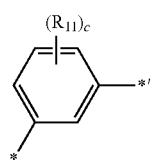

Formula 2B

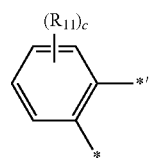

Formula 2C wherein, in Formulae 2A to 2C, $R_{11}$ is selected from among a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; and c is an integer from 1 to 4, provided that when c is 2 or greater, the $R_{11}$ in $(R_{11})_c$ are the same or different from each other.

5. The photosensitive polymer of claim 1, wherein $Ar_2$ is selected from among:

a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthryl group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, and a triazolylene group, and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthryl group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, and a triazolylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group.

6. The photosensitive polymer of claim 1, wherein $Ar_2$ is selected from among:

a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, and a cycloheptadienylene group, and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, and a cycloheptadienylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group.

7. The photosensitive polymer of claim 1, wherein $Ar_2$ is selected from among groups represented by Formulae 3A to 3C:

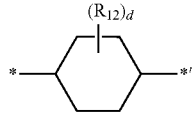

Formula 3A

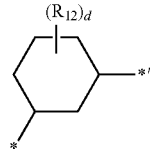

Formula 3B

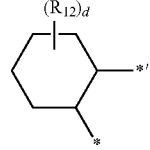

Formula 3C wherein, in Formulae 3A to 3C, $R_{12}$ is selected from among a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; and d is an integer from 1 to 8, provided that when d is 2 or greater, the $R_{12}$ in $(R_{12})_d$ are the same or different from each other.

8. The photosensitive polymer of claim 1, wherein a and b are both 1.

9. The photosensitive polymer of claim 1, wherein $R_1$ to $R_4$ are each independently selected from among:

a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group, and a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a phenyl group, a naphthyl group, and an anthryl group.

10. The photosensitive polymer of claim 1, wherein the repeating unit represented by Formula 1 is a repeating unit represented by Formula 1A:

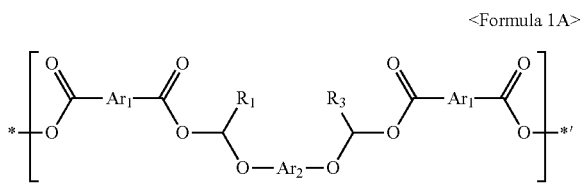

<Formula 1A> wherein, in Formula 1A,

Ar$_1$ is selected from among:
  a phenylene group, a naphthylene group, and a phenanthrenylene group, and
  a phenylene group, a naphthylene group, and a phenanthrenylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group;

Ar$_2$ is selected from among:
  a cyclopropylene group, a cyclobutylene group, a cyclopentylene group, a cyclohexylene group, a cycloheptylene group, a cyclooctylene group, a cyclopentenylene group, a cyclopentadienylene group, a cyclohexcenylene group, a cyclohexadienylene group, and a cycloheptadienylene group, and
  a cyclopropylene group, a cyclobutylene group, a cyclopentylene group, a cyclohexylene group, a cycloheptylene group, a cyclooctylene group, a cyclopentenylene group, a cyclopentadienylene group, a cyclohexcenylene group, a cyclohexadienylene group, and a cycloheptadienylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; and R$_1$ and R$_3$ are each independently selected from among:

a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group, and a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a phenyl group, a naphthyl group, and an anthryl group.

11. The photosensitive polymer of claim 1, wherein the repeating unit represented by Formula 1 is represented by a Repeating unit 1 or 2:

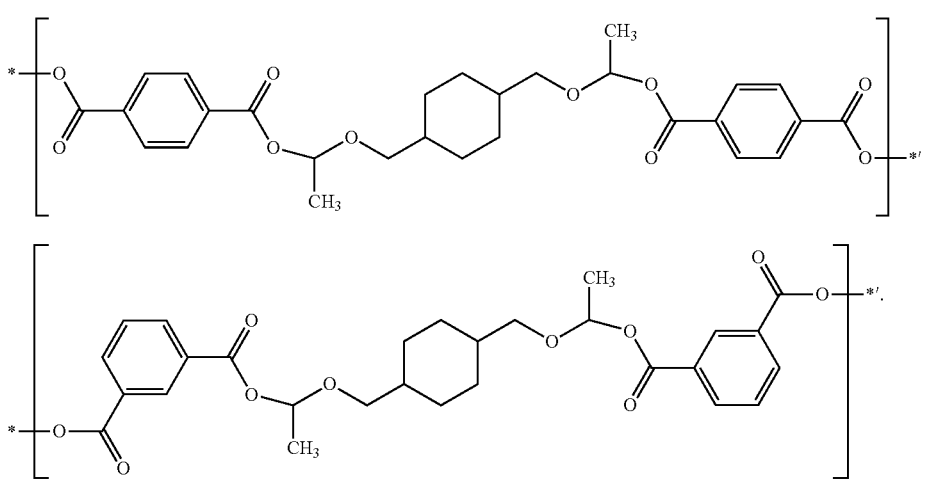

12. A resist composition, comprising:
  a photosensitive polymer including a repeating unit represented by Formula 1 below, the photosensitive polymer having a weight average molecular weight of from about 3,000 to about 50,000;
  a photoacid generator; and
  a solvent:

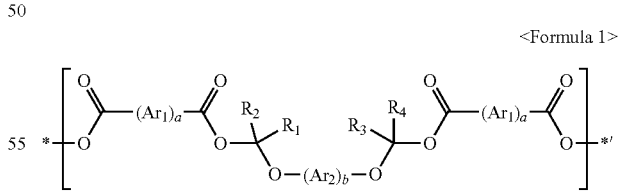

<Formula 1> wherein, in Formula 1,

Ar$_1$ is selected from among:
  a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group, and
  a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_{6-C20}$ arylene group, and a $C_2$-$C_{20}$ heteroarylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{20}$ aryl group, and a $C_2$-$C_{20}$ heteroaryl group;

$Ar_2$ is selected from among:
—C(=O)—, —O—, a C1-C20 alkylene group, a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group, and
a $C_3$-$C_{10}$ cycloalkylene group, a $C_3$-$C_{10}$ cycloalkenylene group, a $C_2$-$C_{10}$ heterocycloalkylene group, a $C_2$-$C_{10}$ heterocycloalkenylene group, a $C_6$-$C_{20}$ arylene group, and a $C_2$-$C_{20}$ heteroarylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{20}$ aryl group, and a $C_2$-$C_{20}$ heteroaryl group;

a and b are each independently an integer from 1 to 5, provided that:
when a is 2 or greater, the $Ar_1$ in $(Ar_1)_a$ are the same or different from each other, and
when b is 2 or greater, the $Ar_2$ in $(Ar_2)_b$ are the same or different from each other; and $R_1$ to $R_4$ are each independently selected from among:
a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group,
a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_6$-$C_{20}$ aryl group, and a $C_2$-$C_{20}$ heteroaryl group; a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, and
a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group.

13. The resist composition of claim 12, wherein the repeating unit represented by Formula 1 is a repeating unit represented by Formula 1A:

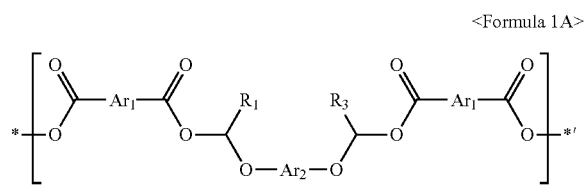

<Formula 1A> wherein, in Formula 1A, $Ar_1$ is selected from among:
a phenylene group, a naphthylene group, and a phenanthrenylene group, and
a phenylene group, a naphthylene group, and a phenanthrenylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group;

$Ar_2$ is selected from among:
a cyclopropylene group, a cyclobutylene group, a cyclopentylene group, a cyclohexylene group, a cycloheptylene group, a cyclooctylene group, a cyclopentenylene group, a cyclopentadienylene group, a cyclohexcenylene group, a cyclohexadienylene group, and a cycloheptadienylene group, and
a cyclopropylene group, a cyclobutylene group, a cyclopentylene group, a cyclohexylene group, a cycloheptylene group, a cyclooctylene group, a cyclopentenylene group, a cyclopentadienylene group, a cyclohexcenylene group, a cyclohexadienylene group, and a cycloheptadienylene group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; and $R_1$ and $R_3$ are each independently selected from among:
a hydrogen atom, a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group, and
a $C_1$-$C_{20}$ alkyl group and a $C_1$-$C_{20}$ alkoxy group that are substituted with at least one of a deuterium atom, a halogen atom, a hydroxyl group, a cyano group, a nitro group, an amino group, an amidino group, a hydrazine, a hydrazone, a carboxylic group or a salt thereof, a sulfonic acid group or a salt thereof, a phosphoric acid group or a salt thereof, a phenyl group, a naphthyl group, and an anthryl group.

14. The resist composition of claim 12, wherein the photoacid generator includes at least one selected from among a sulfonium salt, an iodonium salt, a sulfonyldiazomethane, a N-sulfonyloxydicarboxyimide, and an oximesulfonate.

15. The resist composition of claim 12, further comprising at least one organic base selected from among amine-based materials.

16. A method of forming a resist pattern, the method comprising:
   applying the resist composition of claim 12 onto a substrate;
   removing at least part of the solvent of the resist composition to form a resist film;
   exposing the resist film to light along a predetermined pattern; and
   developing the resist film exposed to the light along the predetermined pattern to form the resist pattern.

17. The method of claim 16, wherein the exposing is performed at room temperature, and the photosensitive polymer of Formula 1 in the resist film is decomposed by the light during the exposing.

18. The method of claim 16, wherein an exposed region of the resist film is removed during the developing.

19. The method of claim 16, wherein an edge region of a cross-section of the resist pattern formed from the developing is substantially perpendicular to a surface of the substrate.

\* \* \* \* \*